United States Patent
Riani et al.

(10) Patent No.: US 10,396,896 B2
(45) Date of Patent: *Aug. 27, 2019

(54) OPTICAL COMMUNICATION INTERFACE UTILIZING N-DIMENSIONAL DOUBLE SQUARE QUADRATURE AMPLITUDE MODULATION

(71) Applicant: INPHI CORPORATION, Santa Clara, CA (US)

(72) Inventors: Jamal Riani, Fremont, CA (US); Sudeep Bhoja, San Jose, CA (US)

(73) Assignee: INPHI CORPORATION, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/163,331

(22) Filed: Oct. 17, 2018

(65) Prior Publication Data
US 2019/0052364 A1   Feb. 14, 2019

Related U.S. Application Data

(60) Continuation of application No. 15/640,032, filed on Jun. 30, 2017, now Pat. No. 10,135,535, which is a
(Continued)

(51) Int. Cl.
| | |
|---|---|
| *H04B 10/27* | (2013.01) |
| *H04L 27/34* | (2006.01) |
| *H03K 9/02* | (2006.01) |
| *H04B 10/61* | (2013.01) |
| *H04B 14/00* | (2006.01) |
| *H04L 27/06* | (2006.01) |

(Continued)

(52) U.S. Cl.
CPC .............. *H04B 10/27* (2013.01); *H03K 9/02* (2013.01); *H04B 10/2504* (2013.01); *H04B 10/61* (2013.01); *H04B 14/004* (2013.01); *H04L 27/02* (2013.01); *H04L 27/06* (2013.01); *H04L 27/34* (2013.01)

(58) Field of Classification Search
None
See application file for complete search history.

(56) References Cited

U.S. PATENT DOCUMENTS

| | | | | |
|---|---|---|---|---|
| 9,020,083 | B2* | 4/2015 | Riani | ........... H04L 27/34 375/353 |
| 9,385,812 | B2* | 7/2016 | Riani | ........... H04L 27/34 |

(Continued)

OTHER PUBLICATIONS

International Search Report for PCT/US2014/021438, dated Sep. 17, 2015.

*Primary Examiner* — Leon Viet Q Nguyen
(74) *Attorney, Agent, or Firm* — Richard T. Ogawa; Ogawa P.C.

(57) ABSTRACT

The present invention is directed to data communication system and methods. More specifically, various embodiments of the present invention provide a communication interface that is configured to transfer data at high bandwidth using nDSQ format(s) over optical communication networks. In certain embodiments, the communication interface is used by various devices, such as spine switches and leaf switches, within a spine-leaf network architecture, which allows large amount of data to be shared among servers.

20 Claims, 11 Drawing Sheets

Related U.S. Application Data continuation of application No. 15/170,843, filed on Jun. 1, 2016, now Pat. No. 9,729,240, which is a continuation of application No. 14/667,236, filed on Mar. 24, 2015, now Pat. No. 9,385,812, which is a continuation of application No. 14/511,087, filed on Oct. 9, 2014, now Pat. No. 9,020,083, which is a division of application No. 13/952,402, filed on Jul. 26, 2013, now Pat. No. 8,885,766, which is a continuation-in-part of application No. 13/791,201, filed on Mar. 8, 2013, now Pat. No. 9,020,346.

(60) Provisional application No. 61/714,543, filed on Oct. 16, 2012, provisional application No. 61/699,724, filed on Sep. 11, 2012.

(51) Int. Cl.
*H04B 10/25* (2013.01)
*H04L 27/02* (2006.01)

(56) References Cited

U.S. PATENT DOCUMENTS

| | | | |
|---|---|---|---|
| 9,729,240 B2 * | 8/2017 | Riani | ............... H04L 27/34 |
| 10,135,535 B2 * | 11/2018 | Riani | ............... H04L 27/34 |
| 2005/0089126 A1 * | 4/2005 | Zerbe | ............... H04L 1/0003 |
| | | | 375/353 |
| 2006/0045197 A1 | 3/2006 | Ungerboeck et al. | |
| 2009/0150745 A1 | 6/2009 | Langner et al. | |
| 2009/0154455 A1 | 6/2009 | Diab | |
| 2011/0311008 A1 | 12/2011 | Slezak et al. | |

\* cited by examiner

OPTICAL COMMUNICATION INTERFACE UTILIZING N-DIMENSIONAL DOUBLE SQUARE QUADRATURE AMPLITUDE MODULATION

CROSS-REFERENCES TO RELATED APPLICATIONS

This instant patent application claims priority to and is a continuation to U.S. application Ser. No. 15/640,032 filed Jun. 30, 2017, which is a continuation of U.S. application Ser. No. 15/170,843 filed Jun. 1, 2016, now U.S. Pat. No. 9,729,240 issued Aug. 8, 2017, which claims priority to and is a continuation of U.S. patent application Ser. No. 14/667,236, filed on Mar. 24, 2015, now U.S. Pat. No. 9,385,812 issued on Jul. 5, 2016, which claims priority to and is a continuation of U.S. patent application Ser. No. 14/511,087, filed on Oct. 9, 2014, now U.S. Pat. No. 9,020,083 issued Apr. 28, 2015, which claims priority to and is a divisional of U.S. patent application Ser. No. 13/952,402, filed on Jul. 26, 2013, now U.S. Pat. No. 8,885,766, issued on Nov. 11, 2014, which claims priority to and is a continuation in part of U.S. patent application Ser. No. 13/791,201, filed on Mar. 8, 2013, now U.S. Pat. No. 9,020,346 issued on Apr. 28, 2015, which claims priority to U.S. Provisional Patent Application No. 61/714,543, filed Oct. 16, 2012, and U.S. Provisional Patent Application No. 61/699,724, filed Sep. 11, 2012, which are incorporated by reference herein for all purposes.

BACKGROUND OF THE INVENTION

The present invention is directed to data communication system and methods.

Over the last few decades, the use of communication networks exploded. In the early days Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs.

Over the past, there have been many types of communication systems and methods. Unfortunately, they have been inadequate for various applications. Therefore, improved communication systems and methods are desired.

BRIEF SUMMARY OF THE INVENTION

The present invention is directed to data communication system and methods. More specifically, various embodiments of the present invention provide a communication interface that is configured to transfer data at high bandwidth using nDSQ format(s) over optical communication networks. In certain embodiments, the communication interface is used by various devices, such as spine switches and leaf switches, within a spine-leaf network architecture, which allows large amount of data to be shared among servers.

In various embodiments of the present invention, n-dimensional DSQ symbols are optimized by reducing symbol density when mapping with PAM mappers. The reduction in symbol density can improved the signal-to-noise ratio of the data transmitted. Depending on the implementation, the DSQ formats, and processes thereof, can be adopted by existing techniques and systems. There are other benefits as well.

DETAILED DESCRIPTION OF THE INVENTION

Figure 1:
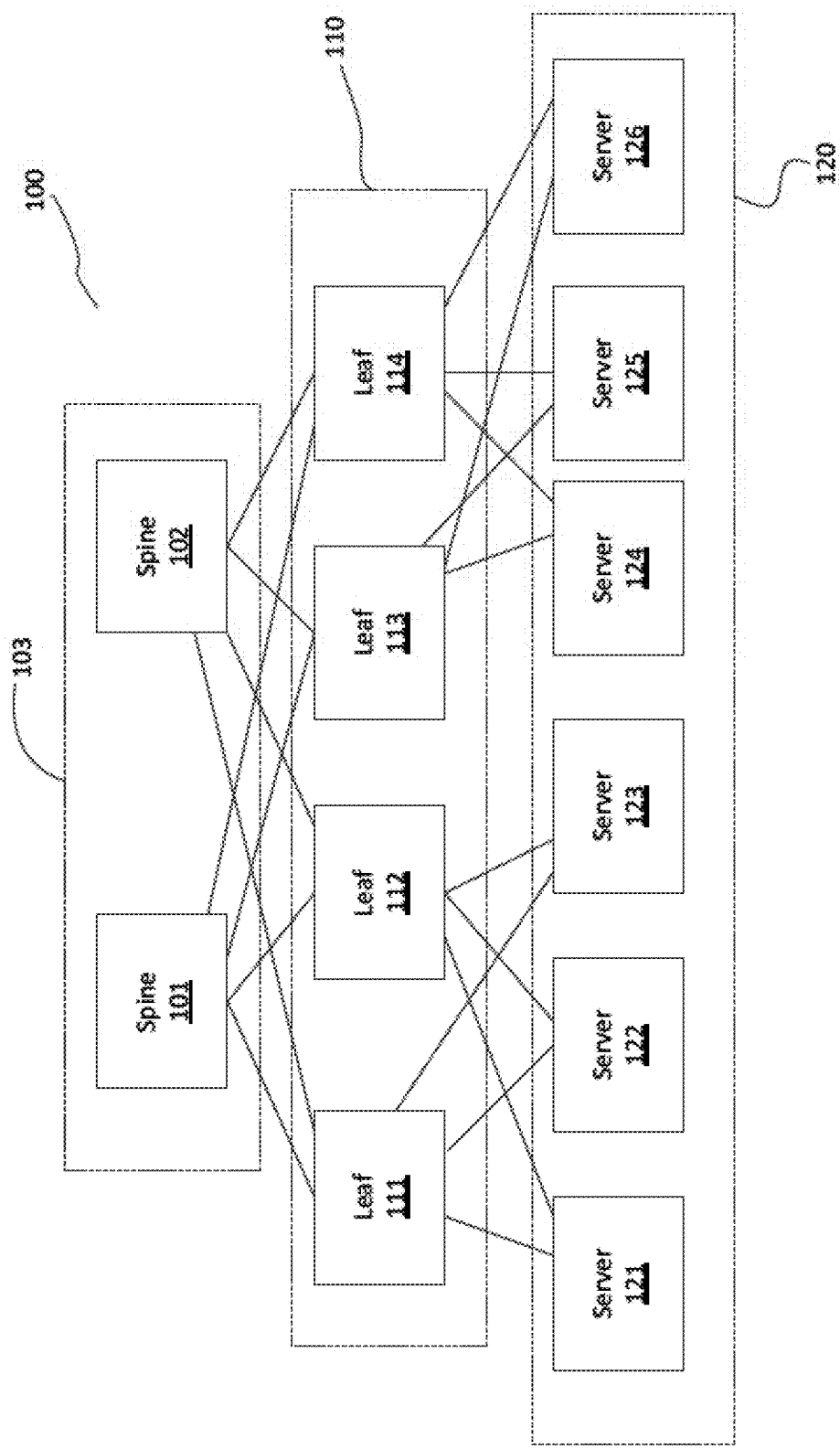
FIG. 1 is a simplified diagram illustrating a leaf-spine architecture 100 according to an embodiment of the present invention.

The present invention is directed to data communication system and methods. More specifically, various embodiments of the present invention provide a communication interface that is configured to transfer data at high bandwidth using nDSQ format(s) over optical communication networks. In certain embodiments, the communication interface is used by various devices, such as spine switches and leaf switches, within a spine-leaf network architecture, which allows large amount of data to be shared among servers.

In the last decades, with advent of cloud computing and data center, the needs for network servers have evolved. For example, the three-level configuration that have been used for a long time is no longer adequate or suitable, as distributed applications require flatter network architectures, where server virtualization that allows servers to operate in parallel. For example, multiple servers can be used together to perform a requested task. For multiple servers to work in parallel, it is often imperative for them to be share large amount of information among themselves quickly, as opposed to having data going back forth through multiple layers of network architecture (e.g., network switches, etc.).

Leaf-spine type of network architecture is provided to better allow servers to work in parallel and move data quickly among servers, offering high bandwidth and low latencies. Typically, a leaf-spine network architecture uses a top-of-rack switch that can directly access into server nodes and links back to a set of non-blocking spine switches that have enough bandwidth to allow for clusters of servers to be linked to one another and share large amount of data.

In a typical leaf-spine network today, gigabits of data are shared among servers. In certain network architectures, network servers on the same level have certain peer links for data sharing. Unfortunately, the bandwidth for this type of set up is often inadequate. It is to be appreciated that embodiments of the present invention utilizes nDSQ coding in leaf-spine architecture that allows large amount (up terabytes of data at the spine level) of data to be transferred via optical network.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

FIG. 1 is a simplified diagram illustrating a leaf-spine architecture 100 according to an embodiment of the present invention. This diagram is merely an example, which should not unduly limit the scope of the claims. One of ordinary skill in the art would recognize many variations, alternatives, and modifications. The leaf-spine architecture 100 comprises servers 120, leaf switches 110, and spine switches 103. It is to be appreciated that depending on the need and specific application, the number and arrangement of the servers and switches may be changed. As shown in FIG. 1, each server may be connected to more than one leaf switch.

For example, server 121 is connected to leaf switches 111 and 112. Similarly, server 122 is connected to leaf switches 111 and 112, and so is server 123. In an exemplary embodiment, server 121 is connected to the leaf switch 111 via optical communication link utilizing pulse amplitude modulation (PAM) and nDSQ mapping. nDSQ and PAM2, PAM4, PAM8, PAM12, PAM16, and/or other variations of PAM may also be used in conjunction with optical communication links in various embodiments of the present invention. The bandwidth of the optical communication link between the server 121 and leaf switch 111 can be over 10 gigabits/s. Each leaf switch, such as leaf switch 111, may be connected to 10 or more servers. In one implementation, a leaf switch has a bandwidth of at least 100 gigabits/s.

In a specific embodiment, a leaf switch comprises a receiver device configured to receive four communication channels, and each of the channels is capable of transferring incoming data at 25 gigabits/s and configured as a PAM-2 format. For example, the incoming data may be received from a processor via a PCI-e interface. Similarly, a server (e.g. server 121) comprises communication interface that is configured to transmit and receive at 100 gigabits/sec (e.g., four channels at 25 gigabits/s per channel), and is compatible with the communication interface of the leaf switches. The spine switches, similarly, comprise communication interfaces for transmitting and receiving data in PAM format. The spine switches may have a large number of communication channels to accommodate a large number of leaf switches, each of which provides switching for a large number of servers.

The leaf switches are connected to spine switches. As shown in FIG. 1, each leaf switch is connected to spine switches 101 and 102. For example, leaf switch 111 is connected to the spine switch 101 and 102, and so are leaf switches 113 and 114. In a specific embodiment, each of the spine switches is configured with a bandwidth of 3.2 terabytes/s, which is big enough to communicate 32 optical communication links at 100 gigabits/s each. Depending on the specific implementation, other configuration and bandwidth are possible as well.

The servers, through the architecture 100 shown in FIG. 1, can communicate with one another efficiently with a high bandwidth. Optical communication links are used between servers and leaf switches, and also between leaf switches and spine switches, and PAM utilized for optical network communication.

Figure 2:
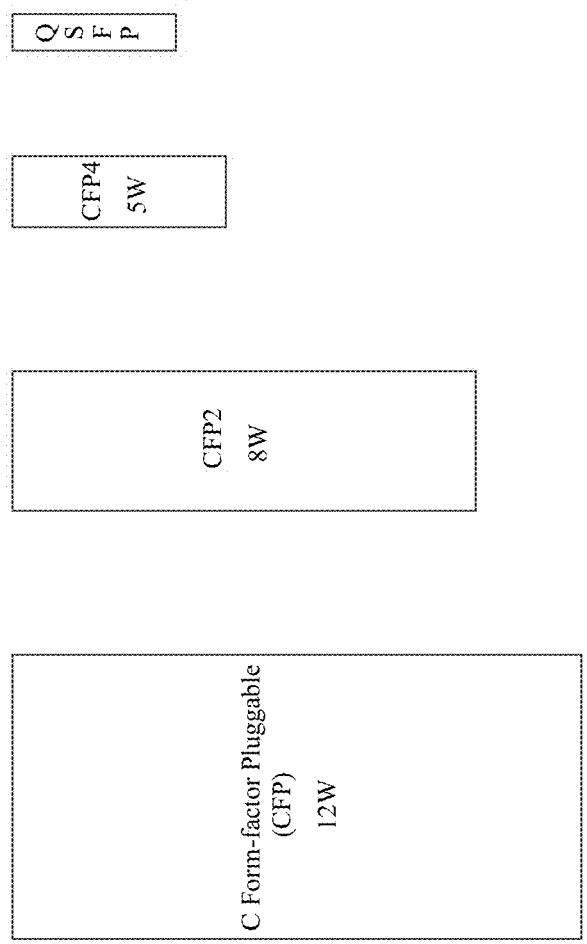
FIG. 2 is a simplified diagram illustrating the form factor of a communication device according to an embodiment of the present invention.

It is to be appreciated that the PAM communication interfaces described above can be implemented in accordance with today communication standards form factors. In addition, afforded by high efficiency level, network transceivers according to embodiments of the present invention can have much lower power consumption and smaller form factor compared to conventional devices. FIG. 2 is a simplified diagram illustrating the form factor of a communication device according to an embodiment of the present invention. Today, C form-factor pluggable (CFP) standard is widely adapted for gigabit network systems. Conventional electrical-connection based CFP transceivers often use 10×10 gigabits/s lines to achieve high bandwidth. With optical connection, CFP transceivers can utilize 10×10 gigabits/s configuration, 4×25 gigabits/s configuration, or others. It is to be appreciated that by utilizing optical communication link and PAM format, a transceiver according to the present invention can have a much smaller form factor than CFP and CFP2 as shown. In various embodiments, communication interfaces according to the invention can have a form factor of CFP4 or QSFP, which are much smaller in size than the CFP. In addition to smaller form factors, the power consumption of communication interfaces according to the present invention can be much smaller. In a specific embodiment, with the form factor of QSFP, the power consumption can be as low as about 3 W, which is about ¼ that of convention transceivers with CFP form factor. The reduce level of power consumption helps save energy at data centers, where thousands (sometimes millions) of these communication devices are deployed.

Figure 3A:
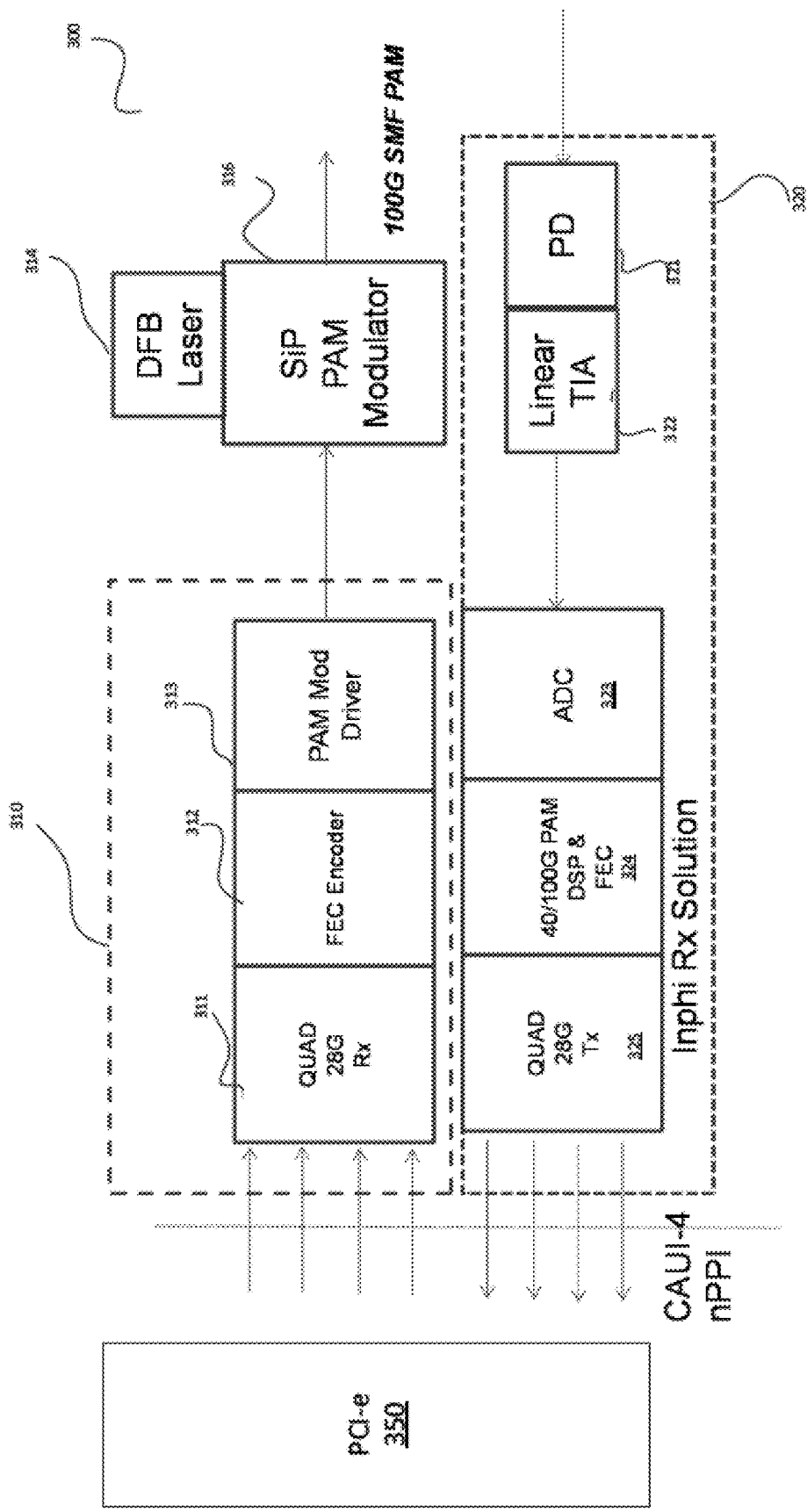
FIG. 3A is a simplified diagram illustrating a communication interface 300 according to an embodiment of the present invention.

FIG. 3A is a simplified diagram illustrating a communication interface 300 according to an embodiment of the present invention. This diagram is merely an example, which should not unduly limit the scope of the claims. One of ordinary skill in the art would recognize many variations, alternatives, and modifications. The communication interface 300 includes transmitter module 310 and a receiver module 320. The transmitter module 310 comprises a receiver 311, encoder 312, and PAM modulation driver 313.

In an embodiment, the communication interface 300 is configured to receive incoming data at through four channels, where each channel is configured at 25 gigabits/s and configured as a PAM-2 format. Using the transmitter module 310, modulator 316, and the laser 314, the communication interface 300 processes data received at 25 gigabits/s from each of the four incoming channels, and transmits PAM modulated optical data stream at a bandwidth of 100 gigabits/s. It is to be appreciated that other bandwidths are possible as well, such as 40 Gbps, 400 Gbps, and/or others.

As shown the transmitter module 310 receives 4 channels of data. It is to be appreciated that other variants of pulse-amplitude modulation (e.g., PAM4, PAM8, PAM12, PAM16, etc.), in addition to PAM-2 format, may be used as well. The transmitter module 310 comprises functional block 311, which includes a clock data recovery (CDR) circuit configured to receive the incoming data from the four communication channels. In various embodiments, the functional block 311 further comprises multiplexer for combining 4 channels for data. For example, data from the 4 channels as shown are from the PCI-e interface 350. For example, the interface 350 is connected to one or more processors. In a specific embodiment, two 2:1 multiplexers are employed in the functional block 311. For example, the data received from the four channels are high-speed data streams that are not accompanied by clock signals. The receiver 311 comprises, among other things, a clock signal that is associated with a predetermined frequency reference value. In various embodiments, the receiver 311 is configured to utilize a phase-locked loop (PLL) to align the received data.

The transmitter module 310 further comprises an encoder 312. As shown in FIG. 3, the encoder 312 comprises a forward error correction (FEC) encoder. Among other things, the encoder 312 provides error detection and/or correction as needed. For example, the data received is in a PAM-2 format as described above. The received data comprises redundancy (e.g., one or more redundant bits) helps the encoder 312 to detect errors. In a specific embodiment, low-density parity check (LDPC) codes are used. The encoder 312 is configured to encode data received from four channels as shown to generate a data stream that can be transmitted through optical communication link at a bandwidth 100 gigabits/s (e.g., combining 4 channels of 25 gigabits/s data). For example, each received is in the PAM-2 format, and the encoded data stream is a combination of four data channels and is in nDSQ format. As described in more details below, data stream is encoded into nDSQ symbols, and n is the number of dimensions. For example, an n dimensional constellation is used for mapping the data into nDSQ symbols.

The PAM modulation driver 313 is configured to drive data stream encoded by the encoder 312. In various embodiments, the receiver 311, encoder 312, and the modulation driver 313 are integrated and part of the transmitter module 310.

The PAM modulator 316 is configured to modulate signals from the transmitter module 310, and convert the received electrical signal to optical signal using the laser 314. For example, the modulator 316 generates optical signals at a transmission rate of 100 gigabits per second. It is to be appreciated that other rate are possible as well, such as 40 Gbps, 400 Gbps, or others. The optical signals are transmitted in a PAM format (e.g., PAM-8 format, PAM12, PAM 16, etc.). In various embodiments, the laser 314 comprises a distributed feedback (DFB) laser. Depending on the application, other types of laser technology may be used as well, as such vertical cavity surface emitting laser (VCSEL) and others.

Figure 3B:
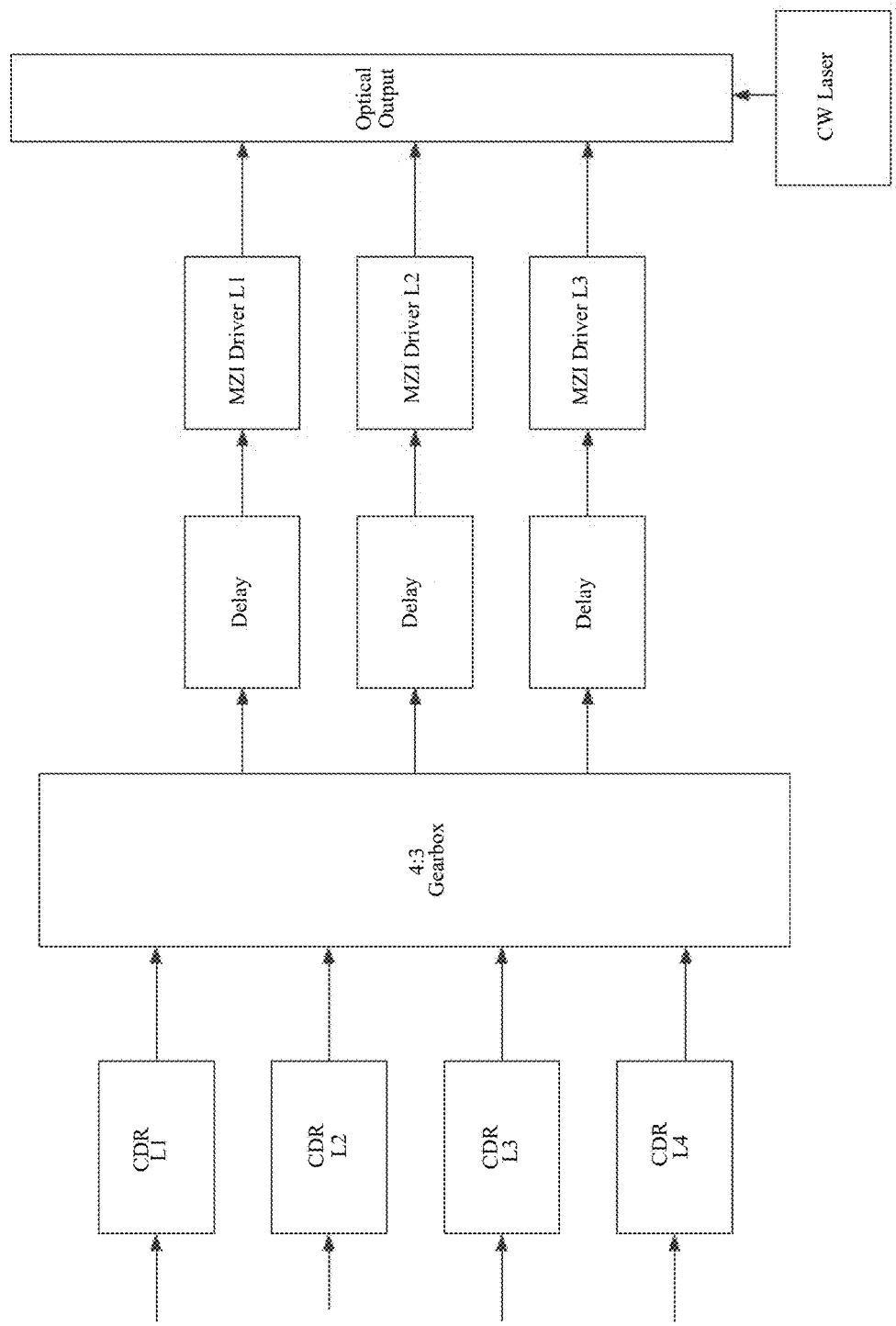
FIG. 3B is a simplified diagram illustrating a segmented optical modulator according to an embodiment of the present invention.

FIG. 3B is a simplified diagram illustrating a segmented optical modulator according to an embodiment of the present invention. This diagram is merely an example, which should not unduly limit the scope of the claims. One of ordinary skill in the art would recognize many variations, alternatives, and modifications. For example, modulated PAM signals modulated for transmission over optical communication links.

Now referring back to FIG. 3A. The communication interface 300 is configured for both receiving and transmitting signals. A receiver module 320 comprise a photo detector 321 that converts incoming data signal in an optical format converts the optical signal to an electrical signal. In various embodiments, the photo detector 321 comprises indium gallium arsenide material. For example, the photo detector 321 can be a semiconductor-based photodiode, such as p-n photodiodes, p-i-n photodiodes, avalanche photodiodes, or others. The photo detector 321 is coupled with an amplifier 322. In various embodiments, the amplifier comprises a linear transimpedance amplifier (TIA). It is to be appreciated by using TIA, long-range multi-mode (LRM) at high bandwidth (e.g., 100 Gb/s or even larger) can be supposed. For example, the TIA helps compensate for optical dispersion in electrical domain using electrical dispersion compensation (EDC). In certain embodiments, the amplifier 322 also includes a limiting amplifier. The amplifier 322 is used to produce a signal in the electrical domain from the incoming optical signal. In certain embodiments, further signal processing such as clock recovery from data (CDR) performed by a phase-locked loop may also be applied before the data is passed on.

The amplified data signal from the amplifier 322 is processed by the analog to digital converter (ADC) 323. In a specific embodiment, the ADC 323 can be a baud rate ADC. For example, the ADC is configured to convert the amplified signal into a digital signal formatted into a 100 gigabit per second signal in a PAM format. For example, the data signals can have nDSQ symbols representing the data stream. The functional block 324 is configured to process the 100 Gb/s data stream and encode it into four at streams at 25 Gb/s each. For example, the incoming optical data stream received by the photo detector 321 is in PAM-8 format at a bandwidth of 100 Gb/s, and at block 324 four data streams in PAM-2 format is generated at a bandwidth of 25 Gb/s. The four data streams are transmitted by the transmitter 325 over 4 communication channels at 25 Gb/s.

It is to be appreciated that there can be many variations to the embodiments described in FIG. 3. For example, different number of channels (e.g., 4, 8, 16, etc.) and different bandwidth (e.g., 10 Gb/s, 40 Gb/s, 100 Gb/s, 400 Gb/s, 3.2 Tb/s, etc.) can be used as well, depending on the application (e.g., server, leaf switch, spine switch, etc.).

Figure 4:
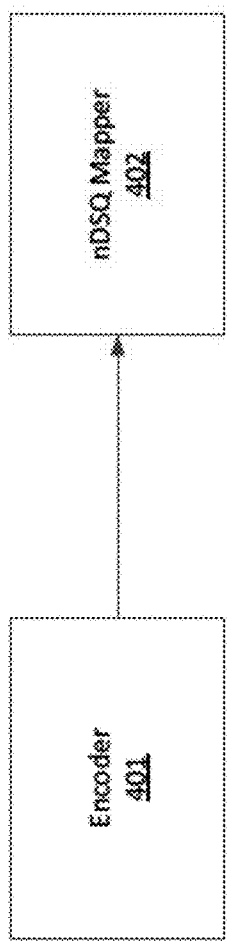
FIG. 4 is a simplified block diagram illustrating the coding and mapping processes according to an embodiment of the present invention.

FIG. 4 is a simplified block diagram illustrating the coding and mapping processes according to an embodiment of the present invention. This diagram is merely an example, which should not unduly limit the scope of the claims. One of ordinary skill in the art would recognize many variations, alternatives, and modifications. As an example, the encoder 401 and the nDSQ mapper 402 are both parts of the FEC 312 in FIG. 3A. In a specific embodiment, the encoder 401 is configured to group bits from the data stream as most significant bits (MSBs) and leas significant bits (LSBs). The MSBs are provided to the nDSQ mapper 402 as data blocks. The LSBs are encoded in various coding schemes. For example, the LSBs may be encoded with BCH and/or RS coding schemes.

Figures 5A, 5B:
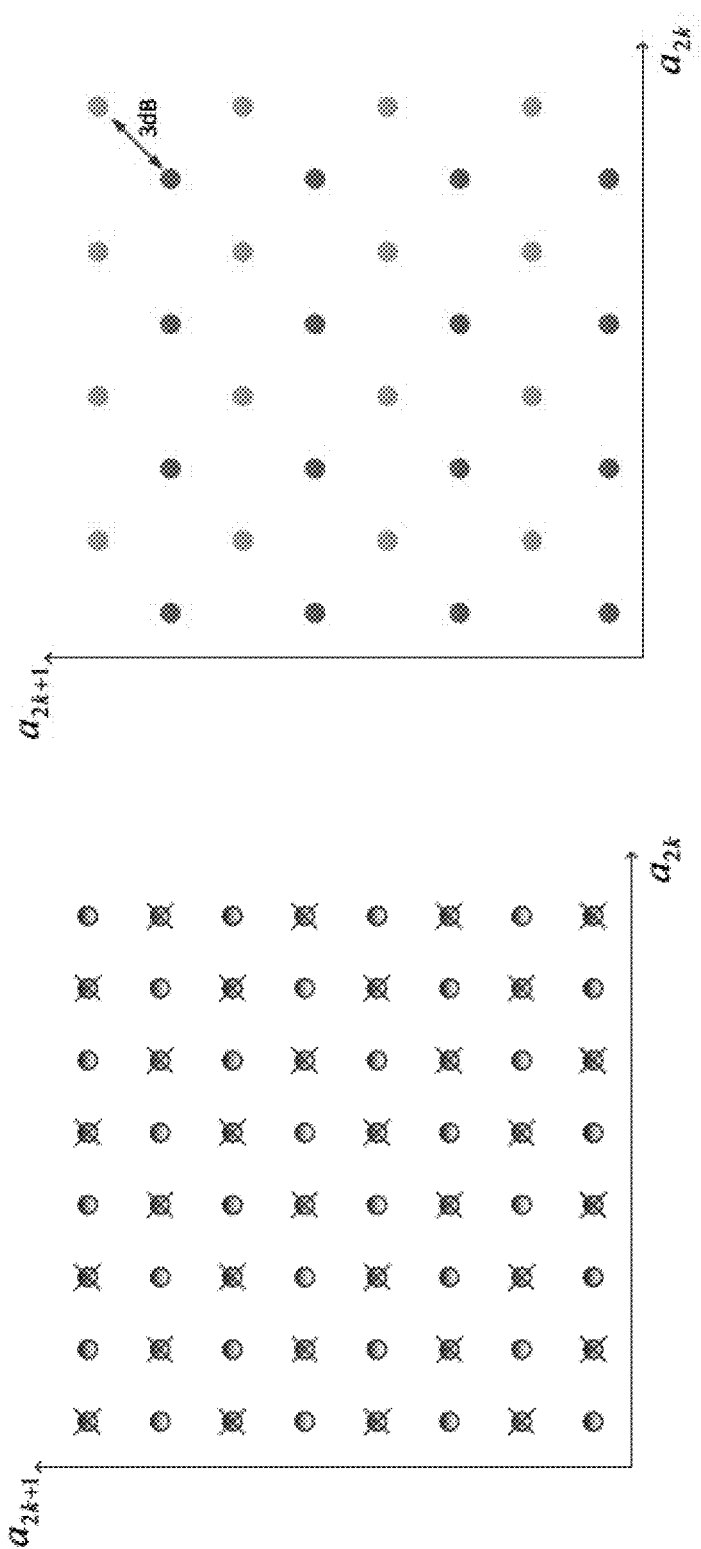
FIGS. 5A and 5B are simplified diagrams illustrating the constellation used in DSQ mapping according to embodiment of the present invention.

It is to be appreciated data stream is mapped into n-dimensional double square quadrature amplitude modulation (nDSQ) coded signals symbols for transmission. It is to be appreciated by using nDSQ symbols for data transmission, a high transmission rate can be achieved. In various embodiments, the present invention provides techniques for nDSQ coding that offer both high efficiency and high accuracy. FIGS. 5A and 5B is a simplified diagram illustrating the constellation used in DSQ mapping according to embodiment of the present invention. This diagram is merely an example, which should not unduly limit the scope of the claims. One of ordinary skill in the art would recognize many variations, alternatives, and modifications. For example, $a_{2k}$ represents a symbol in the data stream, and $a_{2k+1}$ represents the next symbol in the data stream. As shown in FIG. 5A, DSQ32 coding with 2 dimensions is provided, and data symbols are closely packed together.

FIG. 5B illustrates DSQ32 coding where half of the data symbols are removed. By removing every other data symbol, the distance from one data symbol to its adjacent symbol is increased, which results in a 3 dB gain in signal-to-noise ratio (SNR). For example, the change in transmission rate is rate=2.5 bit/symbol. The reduction of the symbols can be achieved by mapping 5 bits to 2 PAM8 symbols from the DSQ constellation. It is to be appreciated that reduction of neighboring symbols can be performed on n dimensional DSQ constellations. For example, for three-dimensional DSQ constellation, where axes are $3_k$, $3_{k+1}$, $3_{k+2}$, the symbol density can be similarly reduced. While reducing the number of data symbols in a constellation would reduce data transmission rate, the SNR is improved.

As an example, a DSQ32 can be interpreted as a (6,5) code where the parity equation is given by Equation 1 below:

$$a_{2k}+a_{2k-1}=0 \bmod 2. \quad \text{(Equation 1)}$$

The PAM8 symbols can be decomposed according to Equation 2 below:

$$a_k = a_k^{pam4} + a_k^{pam2}$$

$$a_k^{pam4} \in \{0,2,4,6\} (PAM4) \text{ and } a_k^{pam2} \in \{0,1\} (PAM2) \quad \text{(Equation 2)}$$

By definition an nD-DSQ symbol of dimension dim is defined as:

$$\underline{a} = [a_1, \ldots, a_{dim}], \text{ where } a_i \in PAM\ 8 \text{ and}$$

$$\sum_{i=1}^{dim} a_i = 0 \bmod 2 \Leftrightarrow \sum_{i=1}^{dim} a_i^{pam2} = 0 \bmod 2$$

As implemented, the n-dimensional DSQ coding consists of mapping 3*dim-1 bits to dim PAM8 symbols (being an nD-DSQ symbol). For example, the nD-DSQ coding is equivalent to 1 bit-error detection on the dim-1 LSB (PAM2) bits. The rate is Rate=3-1/dim bits/symbol. The SNR gain (per neighbor) is still 3 dB but the number of neighbors increases with dim (illustrated later on).

Figure 6:
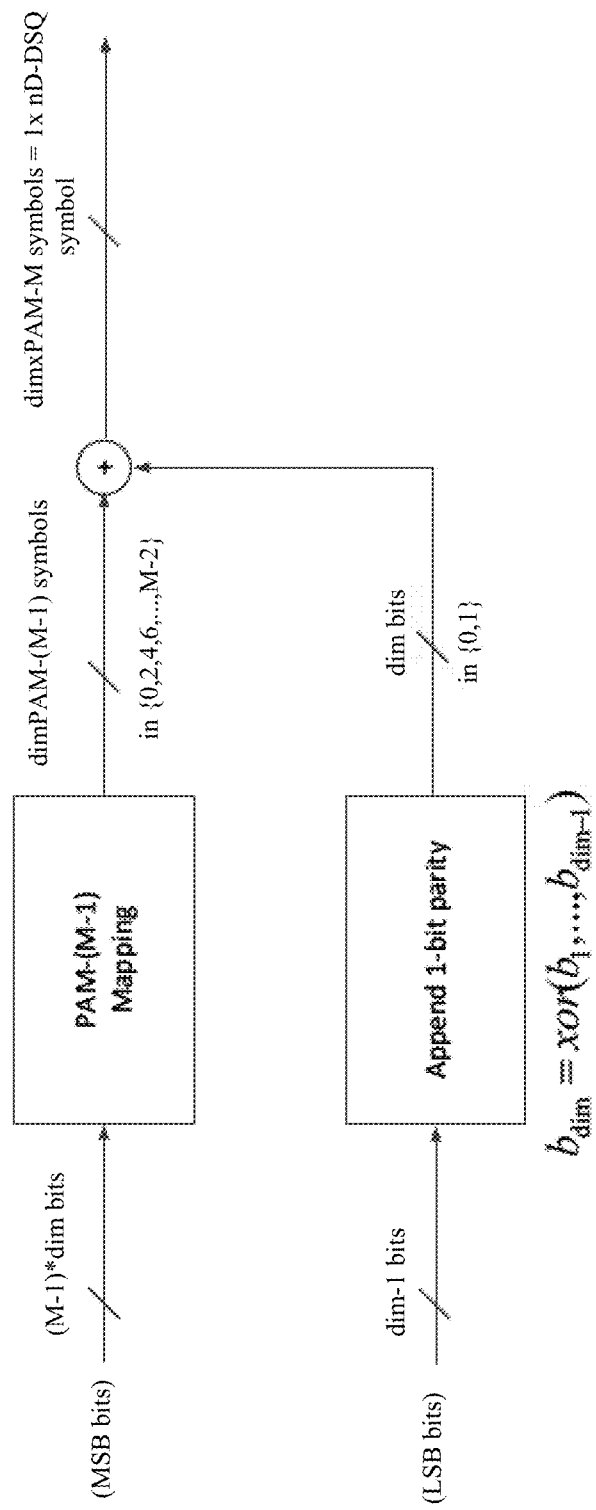
FIG. 6 is a simplified diagram illustrating a PAM mapping according to an embodiment of the present invention.

FIG. 6 is a simplified diagram illustrating a PAM mapping according to an embodiment of the present invention. This diagram is merely an example, which should not unduly limit the scope of the claims. One of ordinary skill in the art would recognize many variations, alternatives, and modifications. As shown in FIG. 6, incoming bits are divided into MSBs and LSBs. For the MSBs, (M-1)*dim number of bits are mapped by the PAM-(M-1) mapper, to provide dim PAM-(M-1) symbols. For example, the mapped MSBs are in {0, 2, 4, 6, ... M-2} format. For the LSBs, (dim-1) number of bits are processed by adding a parity bit to generate dim number of bits. For example, parity bit is used to remove the "odd" sums of the LSBs such that the parity of the DSQ symbol is always even. PAM2 mapping is used or the LSB bits, and the parity bit is added for error detection purpose. The PAM2 and PAM(M-1) outputs are added together to provide n-dimensional DSQ symbol.

Figure 7:
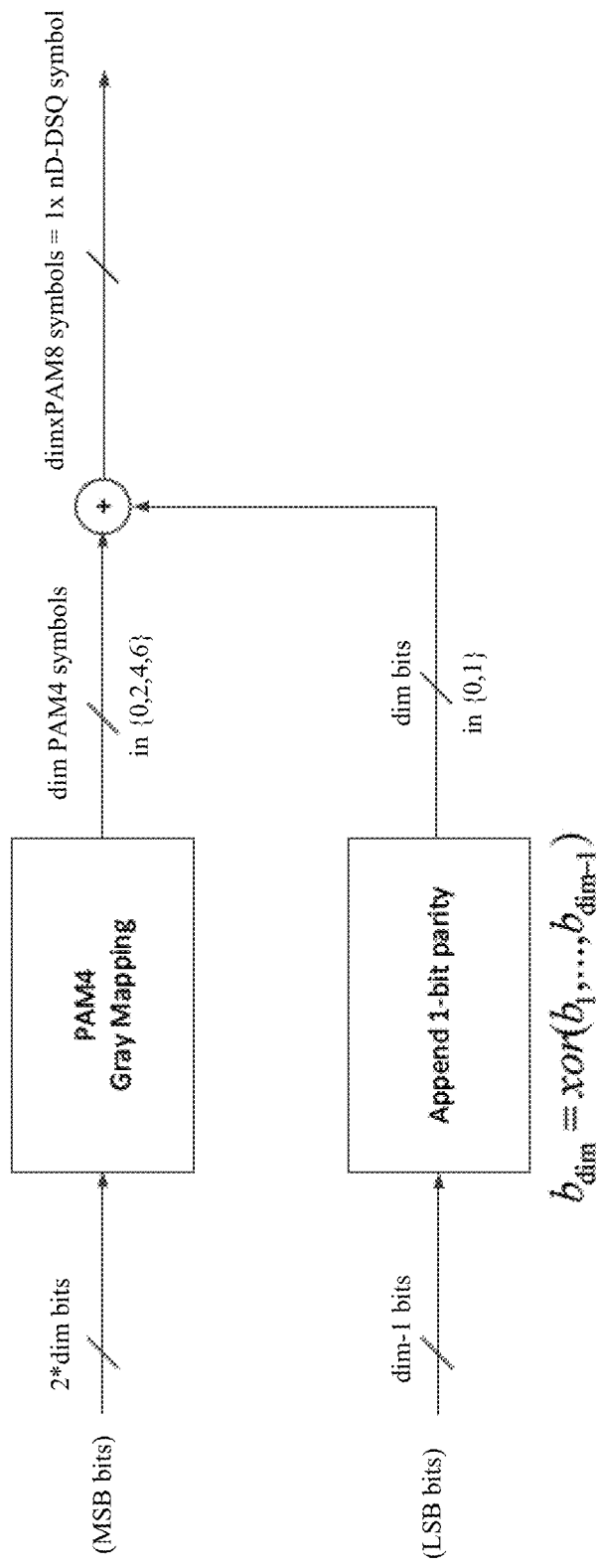
FIG. 7 is a simplified diagram illustrating a PAM8 mapping process according to an embodiment of the present invention.

FIG. 7 is a simplified diagram illustrating a PAM8 mapping process according to an embodiment of the present invention. This diagram is merely an example, which should not unduly limit the scope of the claims. One of ordinary skill in the art would recognize many variations, alternatives, and modifications. As shown in FIG. 7, MSBs are mapped by PAM4 Gray mapping. The LSBs is mapped by PAM2 mapping, and a parity is used to forces an even number of LSB 1's. The parity bit is used to detect single bit errors per dim bits and applies maximum likelihood correction of single error events. The coded MSBs and LSBs are combined, which is a natural multi-level code structure. For example, the closest neighbors to a given nD-DSQ constellation point correspond to flipping 2 bits among the LSB dim bits. This corresponds to 3 dB Euclidian distance gain compared to the uncoded case. For example, each nD-DSQ symbol sees an average number of neighbors bounded by:

$$3 \times n_{choosek}(dim,2)$$

For example, the MSB bits see a 6 dB gain, given the corrected LSB bits. As dimension n increases, rate penalty ratio from the reduction of symbols is reduced.

Figure 8:
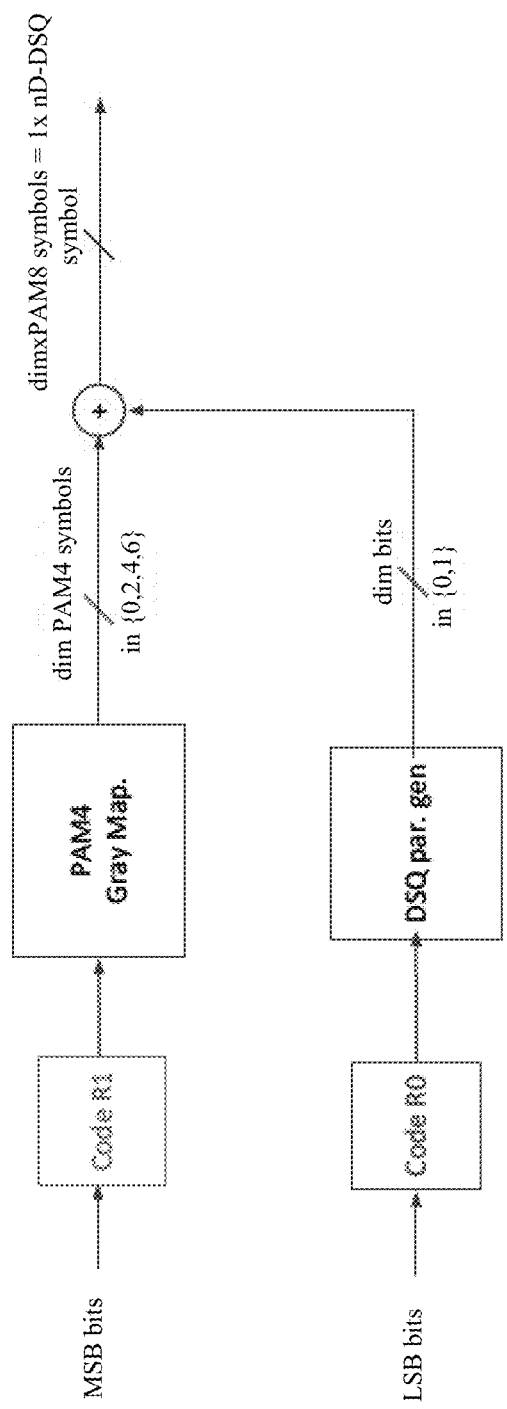
FIG. 8 is a simplified diagram illustrating a PAM8 mapping process with coded MSB and LSB bits according to an embodiment of the present invention.

As described above, before MSBs and LSBs are encoded first before mapped to DSQ symbols. FIG. 8 is a simplified diagram illustrating a PAM8 mapping process with coded MSB and LSB bits according to an embodiment of the present invention. This diagram is merely an example, which should not unduly limit the scope of the claims. One of ordinary skill in the art would recognize many variations, alternatives, and modifications. As shown in FIG. 8, LSBs are coded at a rate R0. For example, the LSBs are encoded in BCH and/or RS code. The LSB channel is coded with a stronger code with rate R0. The MSB channel is coded with a higher rate code R1. For high efficiency, coding for LSB and DSQ is optimized, which depends on the nature of possible error events. For example, LSB may be coded with non-binary code with code symbols that are multiple of (dim−1) bits. In a specific embodiment, the LSBs are coded with (dim−1) interleaved binary codes. For example, interleaving (dim−1) BCH codes are provided to the PAM2 mapper for the LSBs. In a specific embodiment, (dim−1) interleaved BCH (n,k,t) operates in the GF(2^m) codes running in parallel. For example, the BCH decoders sees independent random single bit errors at their input, unless the channel causes error bursts longer than dim. The rate is Rate=2R1+R0*(dim−1)/dim bits/symbol. The relationship between the BCH codes and dim is optimized such that R0*(dim−1)/dim is maximized and the latency constraint is met. For example, the baud rate from coding can be 100e9*257/256/Rate. The BCH Block Latency (BL) is n*dim/Baud_Rate. The MSB outer code contributes to the total latency with only its processing latency in decoder.

Figure 9A:
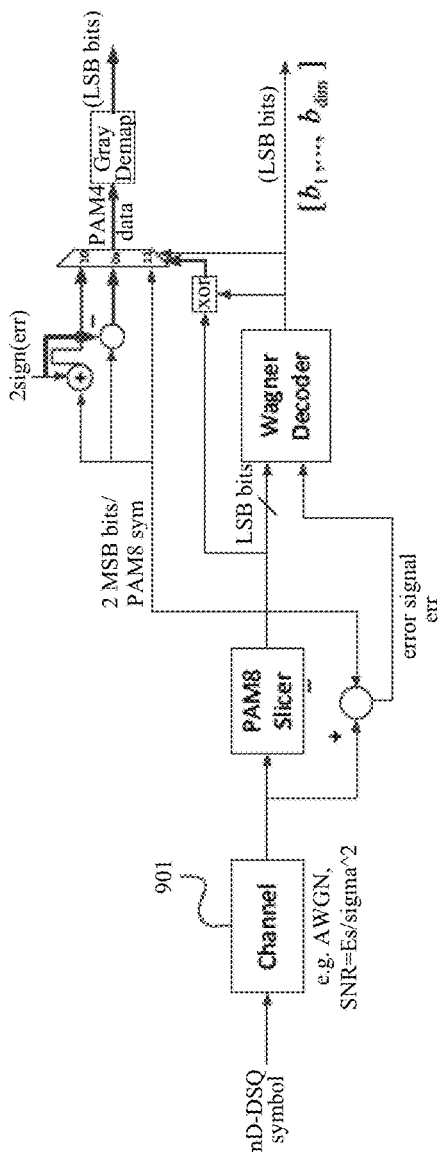
FIGS. 9A and 9B are simplified diagram illustrating decoding process of nDSQ symbols according to an embodiment of the present invention.
Figure 9B:
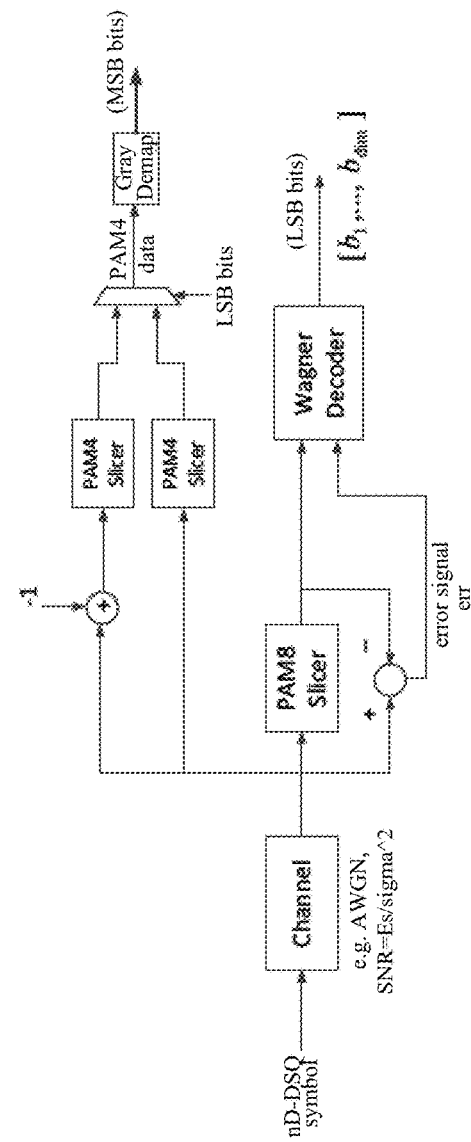

FIGS. 9A and 9B are simplified diagram illustrating decoding process of nDSQ symbols according to an embodiment of the present invention. This diagram is merely an example, which should not unduly limit the scope of the claims. One of ordinary skill in the art would recognize many variations, alternatives, and modifications. In FIG. 9A, n-dimensional DSQ symbols are decoded. The symbols are received through channel 901. During the transmission process through the channel 901, additive white Gaussian noise (AWGN) may be introduced, where the SNR is $SNR=E_s/sigma^2$. The DSQ symbols are divided by the PAM slicer as shown, where the MSBs (e.g., 2 MSBs) are processed on the top portion, and the LSBs are processed at the bottom and decoded by a Wagner decoder. The example, Wagner decoder is used to extract soft information. But it is to be understood that other types of decoders may be used as well. For example, parity bit is used when processing the LSBs for error checking.

For example, the error generation and PAM8 slicer are part of the DSP core. In various embodiments, the error signal is used by all the adaptation loops. The XOR logic is used to determine, based on the output from the Wagner decoder as shown, whether there a zero. If there is an error, the XOR logic element determines whether "1".

FIG. 9B illustrates a nDSQ decoder where MSBs are processed by PAM4 slicer. For example, the LSBs are used as input of the multiplexer 951 to determine whether to add "1". An approximation of the symbol error rate (SER) for the nD-DSQ(dim) is given by:

$$SER \approx 3 \times \binom{dim}{2} \times Q\left(\frac{\sqrt{2}}{\sigma}\right)$$

The factor sqrt(2) inside the Q-function refers to the 3 dB SNR gain and the multiplicity factor $3n_{choosek}(dim,2)$ is the average number of '3 dB' neighbors per nD-DSQ symbol. As dim increase the rate=3−1/dim goes down at the cost of lower 'effective' SNR gain. Depending on the application, the dominant error events are double bit errors per nD-DSQ symbol. For example, at 20 dB SNR, the probability of 4 errors per DSQ symbol is more than 3 order of magnitude lower than that of 2 error symbols. At 21 this amount to 4 orders of magnitude. An approximate expression of the LSB bit error rate (BER) is given by:

$$BER \approx 3 \times (dim-1) \times Q\left(\frac{\sqrt{2}}{\sigma}\right)$$

Figure 10:
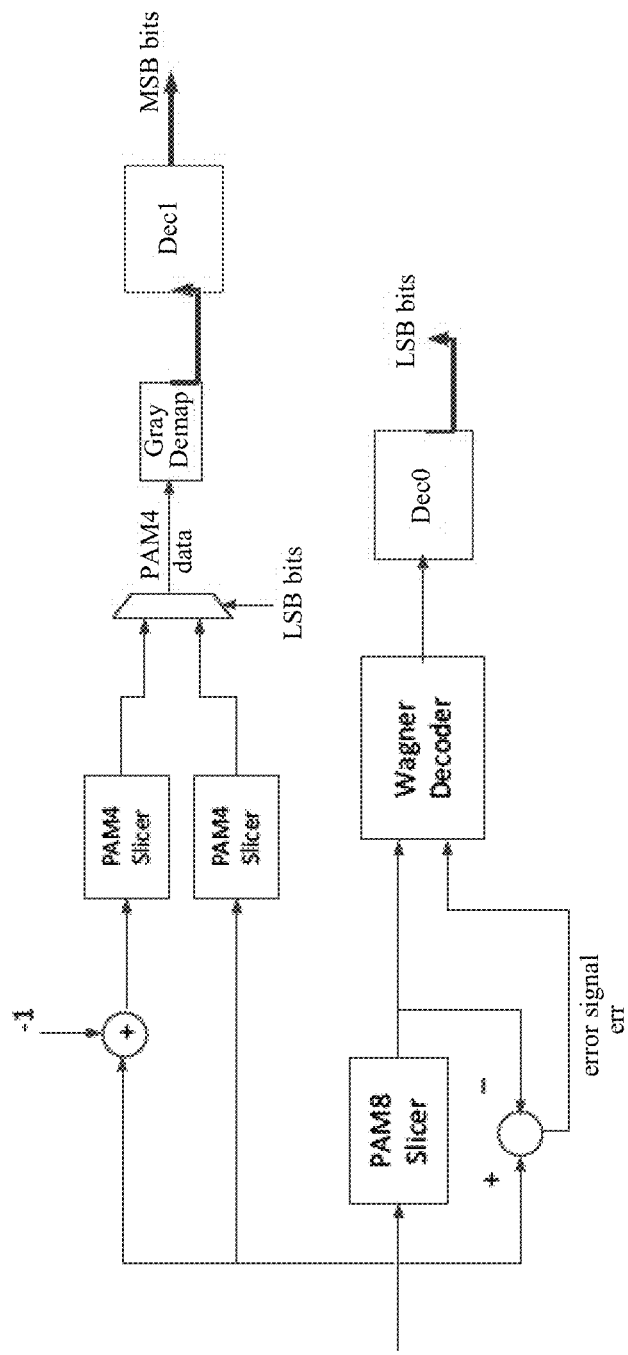
FIG. 10 is a simplified diagram illustrating a decoding nDSQ symbols with LSB and MSB outputs according to an embodiment of the present invention.

FIG. 10 is a simplified diagram illustrating a decoding nDSQ symbols with LSB and MSB outputs according to an embodiment of the present invention. This diagram is merely an example, which should not unduly limit the scope of the claims. One of ordinary skill in the art would recognize many variations, alternatives, and modifications. As shown in FIG. 10, once the MSBs are de-mapped as described above, they are decoded at a rate DEC1, and the LSBs are decoded at a rate of DEC0.

It is to be appreciated that nDSQ can be implemented in various ways according to the embodiments of the present invention. For example, for SNR=21 dB, the following parameters can be used:

$BCH(511,367,t=16), m=9, dim=4, BL=52$ ns and Baud=39.5 GHz.

$BCH(511,314,t=14), m=9, dim=3, BL=39$ ns and Baud=40.1 GHz.

for SNR=20.5 dB, the following parameters can be used:

$BCH(511,349,t=18), m=9, dim=3, BL=38$ ns and Baud=40.8 GHz.

$BCH(1023,783,t=24), m=10, dim=3, BL=77$ ns and Baud=40 GHz.

Typically when decoding failure happens, only one BCH has a detectable decoding failure, (i.e. more than t+1 and less than 2t errors). For example, when using the decoded bits from the remaining dim−2 good BCH decoders and re-do Wagner decoding with only 2 LSB bits per DSQ symbol, the bit belongs to the failing BCH and the DSQ parity bit. The raw bit error rate after this second Wagner decoding is reduced by 1/(dim−1) and becomes that of 2D-DSQ32:

$$BER \approx 3 \times Q\left(\frac{\sqrt{2}}{\sigma}\right)$$

This process can reduce the BER at BCH output by:

$$\left(\frac{1}{dim-1}\right)^{t+1}$$

For example, the process provides extra SNR margin at the cost of 1 more BCH processing latency.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method for processing n-dimensional double square quadrature amplitude modulation (nDSQ) coded signals for pulse amplitude modulation with m levels (PAMm), the method comprising:
receiving nDSQ symbols, the nDSQ symbols including a first nDSQ symbol;
dividing the nDSQ symbols into a first segment representing most significant bits (MSBs) and a second segment representing least significant bits (LSBs);
processing the second segment to generate an error indication based at least on a parity check;
generating PAM (m/2) data by multiplexing the first segment and the error indication; and mapping the PAM (m/2) data to the MSBs bits;
wherein n is associated with a number of dimensions and is 2 or greater, and m is 2 or greater.

2. The method of claim 1 further comprising decoding the second segment using a Wagner decoder.

3. The method of claim 1 further comprising adding the MSBs and LSBs into a decoded data stream.

4. The method of claim 1 further comprising performing Gray-mapping on the PAM(m/2) data on MSB bits.

5. The method of claim 1 wherein m is 8, 12, 16, or 32.

6. The method of claim 1 further comprising receiving the nDSQ symbols through a channel.

7. The method of claim 1 wherein the nDSQ symbols are divided by a splicer.

8. The method of claim 1 further comprising determining whether to add "1" to the first segment based at least on the error indication.

9. The method of claim 1 wherein the nDSQ symbols are characterized by a data rate of at least 25 Gbps.

10. The method of claim 1 further comprising generating a clock signal based on the analog signals.

11. The method of claim 1 wherein the LSBs are encoded by Bose Chaudhuri Hocquenghem (BCH) and/or Reed Solomon (RS) coding scheme.

12. A method for processing n-dimensional double square quadrature amplitude modulation (nDSQ) coded signals for pulse amplitude modulation with m levels (PAMm), the method comprising:
dividing nDSQ symbols of the nDSQ coded signals into a first segment representing most significant bits (MSBs) and a second segment representing least significant bits (LSBs);
decoding the second segment to generate an error indication based at least on a parity check; and
generating PAM (m/2) data using the first segment and the error indication; and
wherein n is associated with a number of dimensions and is 2 or greater, and m is 2 or greater.

13. The method of claim 12 further comprising applying maximum likelihood correction using the error indication.

14. The method of claim 12 further comprising processing the MSBs with a PAM4 slicer.

15. A communication device for processing n-dimensional double square quadrature amplitude modulation (nDSQ) coded signals for pulse amplitude modulation with m levels (PAMm), the communication device coupled with the network, the communication device comprising:
a phase-lock loop for generating clock signals;
a channel for receiving nDSQ symbols;
a splicer configured to divide the nDSQ symbol into a first segment representing most significant bits (MSBs) and a second segment representing least significant bits (LSBs);
a decoder configured to process the second segment to generate an error indication based at least on a parity check;
a multiplexer configured to generate PAM (m/2) data using the first segment and the error indication; and
a de-mapping module configured to map the PAM (m/2) data to the MSBs bits;
wherein n is associated with a number of dimensions and is 2 or greater, and m is 2 or greater.

16. The device of claim 15 further comprising a linear trans-impedance amplifier (TIA) for converting optical signals received from a source to analog signals.

17. The device of claim 16 further comprising an analog-to-digital converter (ADC) for converting the analog signals to nDSQ symbols.

18. The device of claim 15 further comprising a photo-detector for receiving the optical signals.

19. The device of claim 15 wherein the decoder comprises a Wagner decoder.

20. The device of claim 15 wherein the LSBs are encoded by Bose Chaudhuri Hocquenghem (BCH) and/or Reed Solomon (RS) coding scheme.

* * * * *